(12) United States Patent
Wu et al.

(10) Patent No.: US 9,462,719 B2
(45) Date of Patent: Oct. 4, 2016

(54) PLUG-IN MECHANISM, SUBRACK INCLUDING PLUG-IN MECHANISM, AND FINISHED BOARD

(71) Applicant: HUAWEI TECHNOLOGIES CO., LTD., Shenzhen, Guangdong (CN)

(72) Inventors: Dingqiang Wu, Shenzhen (CN); Dongli Wang, Shenzhen (CN); Yao Li, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 8 days.

(21) Appl. No.: 14/543,265

(22) Filed: Nov. 17, 2014

(65) Prior Publication Data
US 2015/0070858 A1 Mar. 12, 2015

Related U.S. Application Data

(63) Continuation of application No. PCT/CN2013/070905, filed on Jan. 23, 2013.

(30) Foreign Application Priority Data

Jul. 20, 2012 (CN) .......................... 2012 1 0253291

(51) Int. Cl.
*H05K 5/00* (2006.01)
*H05K 7/14* (2006.01)

(52) U.S. Cl.
CPC .......... *H05K 7/1431* (2013.01); *H05K 7/1409* (2013.01); *H05K 7/1417* (2013.01); *H05K 7/1487* (2013.01)

(58) Field of Classification Search
USPC ........... 361/747, 728–730, 755, 727, 679.57; 439/157
See application file for complete search history.

(56) References Cited

U.S. PATENT DOCUMENTS 5,481,431 A * 1/1996 Siahpolo ................. G06F 1/184
361/679.31
5,586,003 A * 12/1996 Schmitt ................... G06F 1/184
312/332.1

(Continued)

FOREIGN PATENT DOCUMENTS

CN 2901619 5/2007
CN 101873781 10/2010

(Continued)

OTHER PUBLICATIONS

Chinese Office Action dated Aug. 4, 2014 in corresponding Chinese Patent Application No. 201210253291.6.

(Continued)

*Primary Examiner* — Hung S Bui
(74) *Attorney, Agent, or Firm* — Staas & Halsey LLP

(57) ABSTRACT

A plug-in mechanism, a subrack and a finished board are provided. The plug-in mechanism implements fast and reliable plug-in and plug-out by using a lever assistance effect and a gearing effect of a gear. The plug-in mechanism is configured to be disposed between a sub-carrier frame and a parent carrier frame to implement plug-in and plug-out of the sub-carrier frame in the parent carrier frame, and the plug-in mechanism includes a driving part and a gearing part, where the driving part includes an ejector lever, the gearing part includes at least one gear that is engaged successively, a gear at one end is connected to the ejector lever, each of the at least one gear is fastened onto the sub-carrier frame by using a rotating shaft, and the at least one gear is connected to the parent carrier frame by using a linkage structure.

10 Claims, 2 Drawing Sheets

(56) References Cited

U.S. PATENT DOCUMENTS

| | | | | |
|---|---|---|---|---|
| 5,721,669 | A | * | 2/1998 | Becker ................. G11B 33/124 361/679.31 |
| 5,873,745 | A | * | 2/1999 | Duclos ............. H01R 13/62944 439/157 |
| 6,118,668 | A | * | 9/2000 | Scholder ................. G06F 1/184 361/679.32 |
| 6,685,489 | B1 | | 2/2004 | Rubenstein et al. |
| 7,771,218 | B2 | * | 8/2010 | Jaramillo ............. H05K 7/1492 439/157 |
| 9,122,458 | B2 | * | 9/2015 | Yu ........................... G06F 1/185 |
| 2004/0242039 | A1 | * | 12/2004 | Griffin ................. H05K 7/1409 439/157 |
| 2010/0033924 | A1 | | 2/2010 | Olesiewicz et al. |
| 2012/0240704 | A1 | | 9/2012 | Li et al. |

FOREIGN PATENT DOCUMENTS

| | | |
|---|---|---|
| CN | 201716622 | 1/2011 |
| CN | 102480858 | 5/2012 |
| CN | 102593630 | 7/2012 |
| CN | 102781194 | 11/2012 |

OTHER PUBLICATIONS

PCT International Search Report dated May 2, 2013 in corresponding International Patent Application No. PCT/CN2013/070905.
International Search Report mailed May 2, 2013, in corresponding International Patent Application No. PCT/CN2013/070905.

* cited by examiner

PLUG-IN MECHANISM, SUBRACK INCLUDING PLUG-IN MECHANISM, AND FINISHED BOARD

CROSS-REFERENCE TO RELATED APPLICATIONS

This application is a continuation of International Application No. PCT/CN2013/070905, filed on Jan. 23, 2013, which claims priority to Chinese Patent Application No. 201210253291.6, filed on Jul. 20, 2012, both of which are hereby incorporated by reference in their entireties.

TECHNICAL FIELD

The present invention relates to a power mechanism, and in particular, to a plug-in mechanism, a subrack and a finished board which both include the plug-in mechanism.

BACKGROUND

As people impose an increasingly high requirements on performance of a high-end server, more Central Processing Units (CPUs) and Dual In-line Memory Modules (DIMMs) are required on a single node. Because dimensions of a shelf restrict a size of a Printed Circuit Board (PCB) improving hardware density becomes an orientation of efforts in the industry. In an existing method, on a basis of placing a CPU and a DIMM on a traditional single-layer mainboard, a CPU and a DIMM are placed on both the mainboard and a daughter board by combining the mainboard with the daughter board, and then the mainboard and the daughter board are connected by using a connector.

In the prior art, a manner for mounting a daughter board and a mainboard is generally: mounting a stud on the mainboard, and after a connector on the daughter board is adapted to a connector on the mainboard, connecting the daughter board to the stud by using a screw, so as to implement fastening of the mainboard and the daughter board.

However, the manner for mounting a daughter board and a mainboard in the prior art has at least the following defects:

1. Stud strength at each corner tends to be different, which causes imbalance of the daughter board or fragility of mounting and further causes local deformation or even fracture of the daughter board.

2. When the daughter board is being detached, a large force is required for disengaging the connector, which tends to cause damage to the daughter board.

3. An additional tool, such as a screwdriver, is required for detaching the daughter board, it takes a long time to perform a replacement, and screw-free mounting cannot be implemented.

SUMMARY

Embodiments of the present invention provide a plug-in mechanism, a subrack including the plug-in mechanism, and a finished board, so as to implement fast and reliable plug-in and plug-out by using a lever assistance effect, and a gearing effect of a gear.

To achieve the foregoing objective, the embodiments of the present invention adopt the following technical solutions:

According to one aspect, an embodiment of the present invention provides a plug-in mechanism, where the plug-in mechanism is configured to be disposed between a sub-carrier frame and a parent carrier frame to implement plug-in and plug-out of the sub-carrier frame in the parent carrier frame, and the plug-in mechanism includes a driving part and a gearing part, where:

the driving part includes an ejector lever; and the gearing part includes at least one gear that is engaged successively, and a gear at one end is connected to the ejector lever, the at least one gear that is engaged successively is fastened onto the sub-carrier frame by using a rotating shaft, and all or a part of the at least one gear that is engaged successively is connected to the parent carrier frame by using a linkage structure.

According to one aspect, an embodiment of the present invention provides a subrack, including a sub-carrier frame and a parent carrier frame, where a foregoing plug-in mechanism is disposed on two opposite sides of the sub-carrier frame and two corresponding sides of the parent carrier frame.

According to one aspect, an embodiment of the present invention provides a finished board, including a daughter board, a mainboard, and a foregoing subrack, where the daughter board and the mainboard are disposed in a sub-carrier frame and a parent carrier frame respectively, and plug-in and plug-out of the sub-carrier frame in the parent carrier frame implement connection and detachment between the daughter board and the mainboard.

According to the plug-in mechanism, the subrack including the plug-in mechanism, and the finished board provided by the embodiments of the present invention, fast and reliable plug-in and plug-out are implemented by using a lever assistance effect, and a gearing effect of a gear. Therefore, the following problems are addressed: When a stud and a screw are used for connection, strength of a copper stud at each corner is different, which causes imbalance of a daughter board or fragility of mounting, and further causes local deformation or even fracture of the daughter board; when the daughter board is being detached, a large force is required for disengaging a connector, which tends to cause damage to the daughter board; and an additional tool, such as a screwdriver, is required for detaching the daughter board, it takes a long time to perform a replacement, and screw-free mounting cannot be implemented.

BRIEF DESCRIPTION OF DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
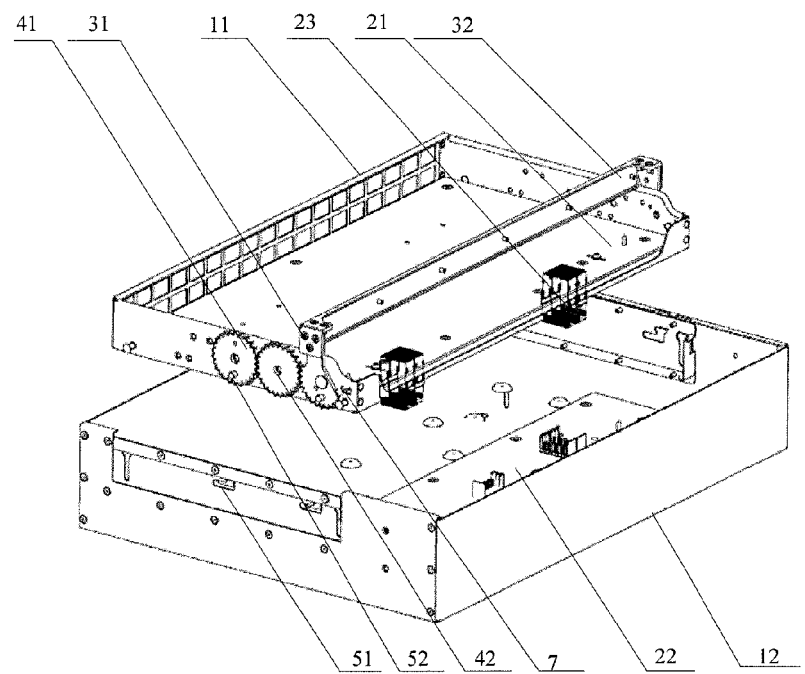
FIG. 1 is a schematic structural diagram of a finished board according to an embodiment of the present invention.

Referring to FIG. 1, an embodiment of the present invention provides a plug-in mechanism 100, a subrack 1 including the plug-in mechanism 100, and a finished board 2. An embodiment of the plug-in mechanism 100 is included in an embodiment of the subrack 1, and the embodiment of the subrack 1 is included in an embodiment of the finished board 2, and therefore, embodiments of the plug-in mechanism 100 and the subrack 1 are not independently described again.

The finished board 2 includes the subrack 1, a daughter board 21, and a mainboard 22. The subrack 1 includes a sub-carrier frame 11 and a parent carrier frame 12, and the plug-in mechanism 100 that is disposed between the parent carrier frame 12 and the sub-carrier frame 11. By using the plug-in mechanism 100, plug-in and plug-out of the sub-carrier frame 11 in the parent carrier frame 12 can be implemented. The daughter board 21 and the mainboard 22 are disposed in the sub-carrier frame 11 and the parent carrier frame 12 respectively. For example, the mainboard 22 is disposed at a bottom of the sub-carrier frame 11, and the daughter board 21 is disposed at a bottom of the parent carrier frame 12; or, the mainboard 22 is disposed at a bottom of the parent carrier frame 12, and the daughter board 21 is disposed at a bottom of the sub-carrier frame 11. The mainboard 22 and the daughter board 21 may be connected to the sub-carrier frame 11 and the parent carrier frame 12 by means of screw fastening; or, preferably, in order to facilitate detachment, may also be connected by means of clamping, for example, may be connected by means of turtleback clamping. A CPU and a DIMM are placed on each of the daughter board 21 and the mainboard 22, a connector 23 is disposed on the daughter board 21 and the mainboard 22, and a free end of the connector 23 disposed on the daughter board 21 can be plug-connected to a free end of the connector 23 disposed on the mainboard 22. For example, multiple jacks and pins are provided at the free end of the connector 23 disposed on the daughter board 21 and at the free end of the connector 23 disposed on the mainboard 22, a position of a jack at the free end of the connector 23 on the daughter board 21 is corresponding to a position of a pin at the free end of the connector 23 on the mainboard 22, and a position of a pin at the free end of the connector 23 on the daughter board 21 is corresponding to a position of a jack at the free end of the connector 23 on the mainboard 22, thereby implementing plug-connection of the connector 23.

The following describes a structure of the plug-in mechanism 100 and a process of mounting and detaching the daughter board 21 and the mainboard 22 by using an example that the mainboard 22 is disposed at a bottom of the parent carrier frame 12 and the daughter board 21 is disposed at a bottom of the sub-carrier frame 11.

The plug-in mechanism 100 is disposed on two opposite sides of the subrack 2, which ensures levelness and steadiness of the entire mechanism in a plug-in and plug-out process and prevents deformation of the daughter board.

The plug-in mechanism 100 on each side includes a driving part 3 and a gearing part 4, where:
the driving part 3 includes an ejector lever 31; and
the gearing part 4 includes a gear 41, where the gear 41 is connected to the ejector lever 31, the gear 41 is fastened onto the sub-carrier frame 11 by using a rotating shaft 42, and the gear 41 is connected to the parent carrier frame 12 by using a linkage structure 5.

Exemplarily, referring to FIG. 1, outline dimensions of the sub-carrier frame 11 are slightly smaller than interior dimensions of the parent carrier frame 12, which ensures that the sub-carrier frame 11 can be plugged into the parent carrier frame 12. Mutually coordinating guide rails may be disposed on an inner sidewall of the parent carrier frame 12 and an outer sidewall of the sub-carrier frame 11. By using the guide rails, the sub-carrier frame 11 can slide into the parent carrier frame 12.

Figure 2:
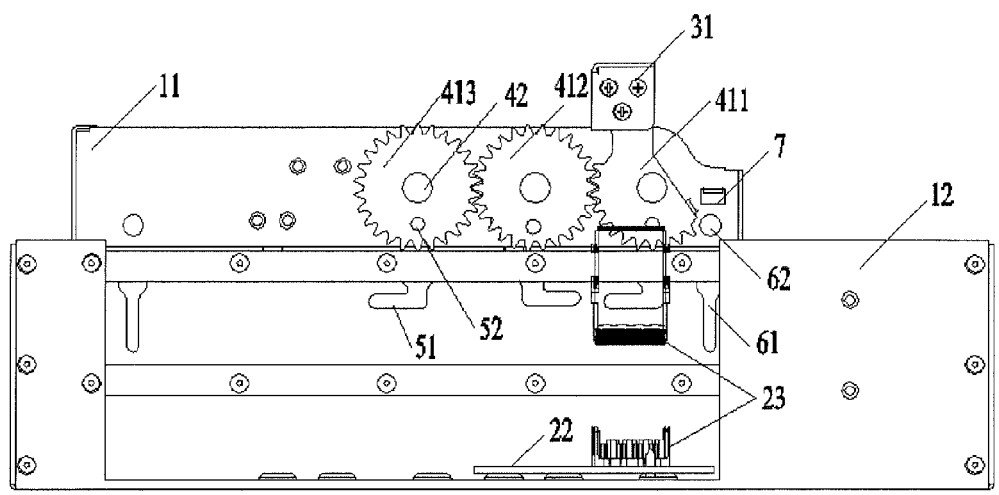
FIG. 2 is a state diagram before a connector of the finished board shown in FIG. 1 is connected.
Figure 3:
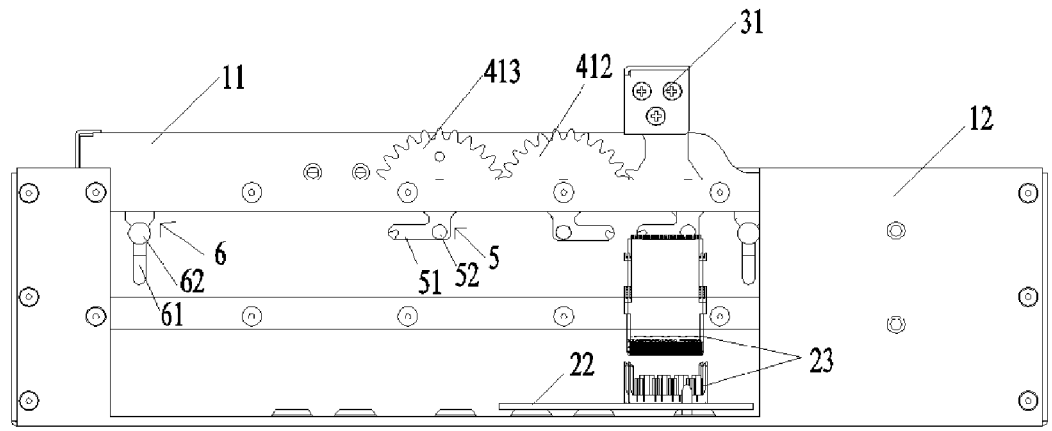
FIG. 3 is a state diagram when a connector of the finished board shown in FIG. 1 begins connecting.
Figure 4:
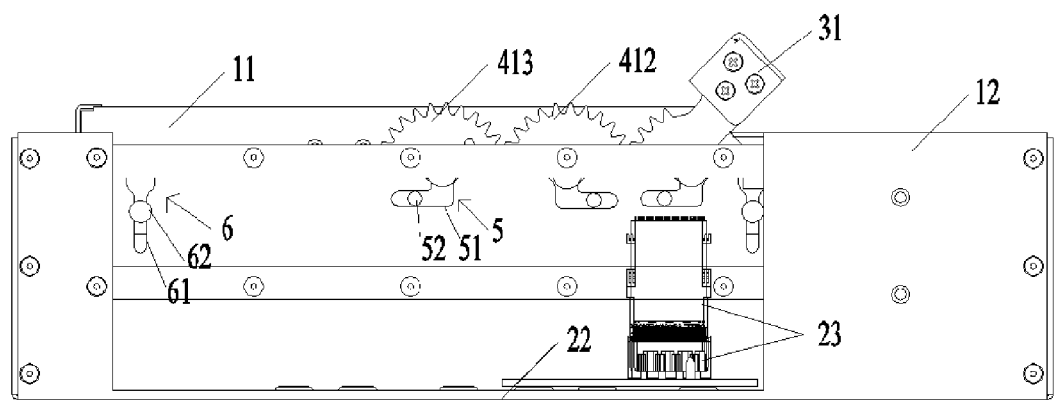
FIG. 4 is a state diagram in a connection process of a connector of the finished board shown in FIG. 1.
Figure 5:
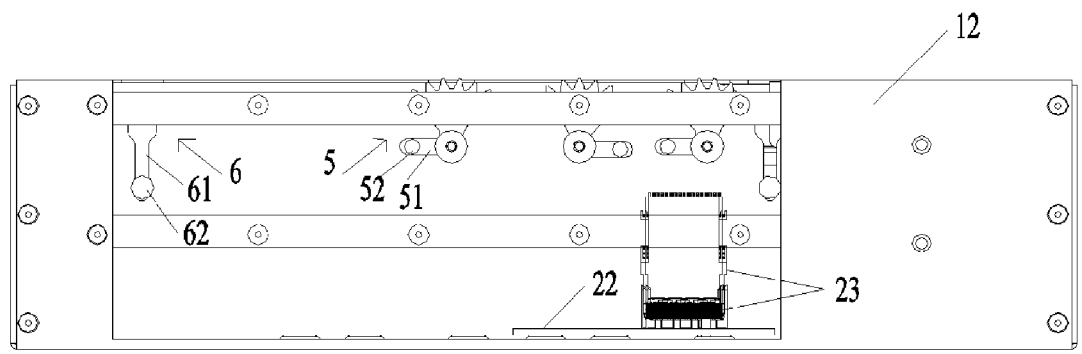
FIG. 5 is a state diagram after a connector of the finished board shown in FIG. 1 is connected effectively.

FIG. 2 to FIG. 5 show a process of mounting and detaching the daughter board 21 and the mainboard 22, where FIG. 2 is a state diagram before the connector 23 of the daughter board 21 is connected to that of the mainboard 22; FIG. 3 is a state diagram when the connector 23 of the daughter board 21 begins connecting to that of the mainboard 22; FIG. 4 is a state diagram in a process in which the connector 23 of the daughter board 21 is connected to that of the mainboard 22; and FIG. 5 is a state diagram after the connector 23 of the daughter board 21 is effectively connected to that of the mainboard 22.

As shown in FIG. 2, first, the daughter board 21 and the mainboard 22 are mounted onto the sub-carrier frame 11 and the parent carrier frame 12 respectively, and the connector 23 on the daughter board 21 is not connected to that on the mainboard 22. As shown in FIG. 3, the parent carrier frame 12 is placed upward horizontally, and the sub-carrier frame 11 slides into the parent carrier frame 12 downward horizontally along a guide rail and gets in position. As shown in FIG. 4, the ejector lever 31 is pulled downward, the ejector lever 31 drives the gear 41 to rotate upward, and the gear 41 brings an upward force to the parent carrier frame 12 by using the linkage structure 5, and is meanwhile subject to a downward counter-acting force from the parent carrier frame 12. Because the parent carrier frame 12 is fastened, the downward counter-acting force from the parent carrier frame 12 drives the sub-carrier frame 11 to move downward and be plugged into the parent carrier frame 12, the daughter board 21 in the sub-carrier frame 11 moves downward with the sub-carrier frame 11, and the connector 23 on the daughter board 21 begins connecting to that on the mainboard 22. As shown in FIG. 5, the connector 23 of the daughter board 21 is effectively connected to that of the mainboard 22, thereby completing mounting of the daughter board 21 and the mainboard 22; and on the contrary, when the ejector lever 31 is pulled upward, the gear 41 drives, by using the linkage structure 5, the sub-carrier frame 11 to move upward, and the connector 23 on the daughter board 21 is disengaged from that on the mainboard 22, thereby completing detachment of the daughter board 21 and the mainboard 22.

Certainly, the parent carrier frame 12 may also be placed upright, and then, after the sub-carrier frame 11 slides into the parent carrier frame 12 horizontally along the guide rail and gets in position, the ejector lever 31 is pulled, so that the sub-carrier frame 11 is plugged into the parent carrier frame 12 along a horizontal direction, thereby completing mounting of the daughter board 21 and the mainboard 22; and the ejector lever 31 is pulled along a reverse direction, so that the sub-carrier frame 11 is unplugged from the parent carrier frame 12 along the horizontal direction, thereby completing detachment of the daughter board 21 and the mainboard 22.

When the mainboard 22 is disposed in the sub-carrier frame 11 and the daughter board 21 is disposed in the parent carrier frame 12, a principle and an implementation manner are the same.

Preferably, referring to FIG. 2 to FIG. 5, the linkage structure 5 may include a horizontal groove 51, and a linkage stud 52 that can slide in the horizontal groove 51. The linkage structure 5 of such a structure has a simple structure and is easy to operate. The linkage stud 52 may be disposed on the gear 41, and the horizontal groove 51 is provided on the parent carrier frame 12; or the linkage stud 52 may be disposed in the parent carrier frame 12, and the horizontal groove 51 is provided on the gear 41. An exemplary manner is: The linkage stud 52 is disposed on the gear 41, and the horizontal groove 51 is provided on the parent carrier frame 12. Because the gear 41 has a certain thickness, mounting strength of the linkage stud 52 can be enhanced, disengagement of the linkage stud 52 is prevented effectively, and reliability of the mechanism is improved. A linkage process of the linkage structure 5 of such a structure is: When the gear 41 rotates upward under an effect of the ejector lever 31, the linkage stud 52 fastened on the gear 41 should perform corresponding arc rotation upward with the gear 41. Restricted by the horizontal groove 51 fastened on the parent carrier frame 12, the linkage stud 52 on the gear 41 moves horizontally along the horizontal groove 51 eventually. The linkage stud 52 generates an upward acting force onto the horizontal groove 51, and is meanwhile subject to a downward counter-acting force from the horizontal groove 51. Under the downward counter-acting force from the horizontal groove 51, the linkage stud 52 drives the sub-carrier frame 11 to move downward, thereby completing mounting of the daughter board 21 and the mainboard 22. When the ejector lever 31 is pulled in a reverse direction, detachment of the daughter board 21 and the mainboard 22 is completed.

Preferably, the gearing part 4 may include two or more gears 41 that are engaged successively; each gear 41 is fastened onto the sub-carrier frame 11 by using a rotating shaft 42; and at least one gear 41 is connected to the parent carrier frame 12 by using the linkage structure 5. Exemplarily, when the linkage structure 5 adopts the foregoing manner, horizontal grooves 51 on the parent carrier frame 12 that is corresponding to linkage studs 52 on two adjacent gears 41 have opposite opening directions. Description is made by using an example that the gearing part 4 includes three gears that are engaged successively. Referring to FIG. 2 to FIG. 5, hereinafter, a gear connected to the ejector lever 31 is referred to as a first gear 411, a gear engaged with the first gear is referred to as a second gear 412, and another gear engaged with the second gear 412 is referred to as a third gear 413. The linkage stud 52 is fastened on the first gear 411, the second gear 412, and the third gear 413, and the horizontal groove 51 is provided on the parent carrier frame 12 correspondingly. A gearing process of the gearing part 4 that adopts such a structure is: After the ejector lever 31 is pulled downward, the ejector lever 31 drives the first gear 411 to rotate clockwise, the first gear 411 drives the second gear 412 to rotate counterclockwise, and the second gear 412 drives the third gear 413 to rotate clockwise. Correspondingly, the linkage stud 52 on the first gear 411 moves horizontally along the horizontal groove 51 under a resultant force of the first gear 411 and the horizontal groove 51. Meanwhile, the horizontal groove 51 generates a downward acting force onto the linkage stud 52 on the first gear 411, and the linkage stud 52 on the second gear 412 moves horizontally along the horizontal groove 51 under a resultant force of the second gear 412 and the horizontal groove 51. A principle is the same as that of the linkage stud 52 on the first gear 411. Because a rotating direction of the second gear 412 is different, a movement direction of the linkage stud 52 on the second gear 412 is opposite to that of the linkage stud 52 on the first gear 411. Meanwhile, the horizontal groove 51 generates a downward acting force onto the linkage stud 52 on the second gear 412. Likewise, the linkage stud 52 on the third gear 413 also moves horizontally along the horizontal groove 51, where a movement direction is the same as that of the linkage stud 52 on the first gear 411. Meanwhile, the horizontal groove 51 generates a downward acting force onto the linkage stud 52 on the third gear 413. This is equivalent to: The parent carrier frame 12 generates three downward force application points onto the sub-carrier frame 11, and drives the sub-carrier frame to move downward, thereby completing mounting of the daughter board 21 and the mainboard 22. When the ejector lever 31 is pulled upward, a process is reverse, and the gearing part 4 and the linkage structure 5 drive the sub-carrier frame 11 to move upward, thereby completing detachment of the daughter board 21 and the mainboard 22.

An effect of the gearing part 4 including multiple gears 41 that are engaged successively is: Multiple force application points are generated in a plug-in and plug-out process, so that an operation in the plug-in and plug-out process is steadier and more reliable, a force required at each force application point is smaller, an operation is simpler and easier, and a service life of the linkage stud 52 can also be extended. Especially in a case in which the number of connectors 23 is large and a large force is required for plug-in and plug-out, a better effect can be achieved.

Preferably, the plug-in mechanism 100 may further include a guide structure 6. A purpose of the guide structure 6 is to achieve a guiding effect in a movement process of the sub-carrier frame 11, and help with accurate plug-connection between the connector 23 on the daughter board 21 and that on the mainboard 22. The guide structure 6 may include a guide groove 61. and a guide stud 62 that slides in the guide groove 61. An extension direction of the guide groove 61 is mutually perpendicular to an extension direction of the horizontal groove 51, that is, the extension direction of the guide groove 61 is consistent with the movement direction in the plug-in and plug-out of the sub-carrier frame 11 in the parent carrier frame 12. For example, in a case in which the sub-carrier frame 11 is plugged into the parent carrier frame 12 in an upright state, the guide groove 61 is in an upright state; and in a case in which the sub-carrier frame 11 is plugged into the parent carrier frame 12 in a horizontal state, the guide groove 61 extends along a horizontal direction, but is perpendicular to the extension direction of the horizontal groove 61. The guide structure 6 may include more than four groups of guide grooves 61 and guide studs 62, which cooperate with each other and are symmetrically disposed on sides of a carrier frame 1 in which the plug-in mechanism 100 is located. In this embodiment, four groups of guide grooves 61 and guide studs 62 are included and distributed at corners of two sides of the carrier frame 1 in which the plug-in mechanism 100 is located, so that a guiding force is evener, and guiding is smooth. Specifically, the guide groove 61 is provided on the parent carrier frame 12, and the guide stud 62 is disposed on the sub-carrier frame 11. Certainly, the guide groove 61 may also be provided on the sub-carrier frame 11, and the guide stud 62 may be disposed on the parent carrier frame 12.

Exemplarily, an optional structure of the guide structure 6 may also include a guide rod 63 and a guide hole 64 into which the guide rod can be inserted. In a process of plugging the sub-carrier frame 11 into the parent carrier frame 12, an end of the guide rod 63 is inserted into the guide hole 64 correspondingly, which can also achieve a guiding purpose.

The guide structure 6 may include multiple groups of guide rods 63 and guide holes 64 that cooperate with each other. When the multiple groups of guide rods 63 and guide holes 64 that cooperate with each other are distributed symmetrically or evenly, the guiding force is evener, and the guiding effect is better. Specifically, the guide rod 63 may be permanently disposed on the mainboard 22, and the guide hole 64 is correspondingly provided on the daughter board 21; or the guide rod 63 may be permanently disposed on the daughter board 21, and the guide hole 64 is correspondingly provided on the mainboard 22. An optional manner of fastening may be riveting or the like. The guide rod 63 may also directly be a long rivet.

Preferably, a gag lever part 7 is further disposed at one end near the ejector lever 31 on the sub-carrier frame 11, and is configured to lock a position of the ejector lever 31 after the sub-carrier frame 11 is plugged in position. The gag lever part 7 may be an elastic latch hook structure or a bump structure. After the connector 23 on the daughter board 21 is effectively connected to that on the mainboard 22, the ejector lever 31 is clasped by the gag lever part 7, so as to prevent the connector 23 from being crushed. In actual application, a rotational angle of the ejector lever 31 may be calculated according to a distance from initial positions of the connectors 23 on the daughter board 21 and the mainboard 22 to positions of the connectors after the connectors are connected effectively, and according to a size of the gear 41, and further, a specific position of the gag lever part 7 is determined.

Preferably, ejector levers 31 of plug-in mechanisms 100 located on two sides of the carrier frame 1 are connected by using a connecting rod 32, which can implement linkage between the plug-in mechanisms 100 on the two sides of the carrier frame 1 and enable the entire mechanism to be steadier in the plug-in and plug-out process.

According to the plug-in mechanism provided by the embodiment of the present invention, fast and reliable plug-in and plug-out are implemented by using a lever assistance effect, and a gearing effect of a gear. Therefore, the following problems are addressed: When a stud and a screw are used for connection, strength of each copper stud is different, which causes imbalance of a daughter board or fragility of mounting, and further causes local deformation or even fracture of the daughter board; when the daughter board is being detached, a large force is required for disengaging a connector, which tends to cause damage to the daughter board; and an additional tool, such as a screwdriver, is required for detaching the daughter board, it takes a long time to perform a replacement, and screw-free mounting cannot be implemented.

A person of ordinary skill in the art may understand that all or a part of the steps for implementing the foregoing method embodiments may be performed by a program instructing relevant hardware. The program may be stored in a computer readable storage medium. When the program runs, the steps of the foregoing method embodiments are performed. The foregoing storage medium includes any media that can store program code, such as a ROM, a RAM, a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A plug-in mechanism configured to be disposed between a sub-carrier frame and a parent carrier frame to implement plug-in and plug-out of the sub-carrier frame in the parent carrier frame, and the plug-in mechanism comprising:
   a driving part; and
   a gearing part, wherein:
   the driving part comprises an ejector lever; and
   the gearing part comprises at least one gear that is engaged successively, a gear at one end is connected to the ejector lever, each of the at least one gear is fastened onto the sub-carrier frame by using a rotating shaft, and the at least one gear is connected to the parent carrier frame by using a linkage structure, wherein the linkage structure comprises a horizontal groove and a linkage stud that can slide in the horizontal groove.

2. The plug-in mechanism according to claim 1, wherein the linkage stud is disposed on the gear, and the horizontal groove is provided on the parent carrier frame.

3. The plug-in mechanism according to claim 2, wherein when the gearing part comprises two or more gears that are engaged successively, horizontal grooves on the parent carrier frame that is corresponding to linkage studs on two adjacent gears have opposite opening directions.

4. The plug-in mechanism according to claim 1, further comprising a gag lever part, wherein the gag lever part is disposed at one end near the ejector lever on the sub-carrier frame, and is configured to lock a position of the ejector lever after the sub-carrier frame is plugged in position.

5. The A plug-in mechanism configured to be disposed between a sub-carrier frame and a parent carrier frame to implement plug-in and plug-out of the sub-carrier frame in the parent carrier frame, and the plug-in mechanism comprising:
   a driving part; and
   a gearing part, wherein:
   the driving part comprises an elector lever; and
   the gearing part comprises at least one gear that is engaged successively, a gear at one end is connected to the elector lever, each of the at least one gear is fastened onto the sub-carrier frame by using a rotating shaft, and the at least one gear is connected to the parent carrier frame by using a linkage structure, the plug-in mechanism further comprising a guide structure comprising a guide groove and a guide stud that slides in the guide groove, and an extension direction of the guide groove is mutually perpendicular to an extension direction of the horizontal groove.

6. The plug-in mechanism according to claim 5, wherein the guide groove is provided on the parent carrier frame, and the guide stud is disposed on the sub-carrier frame; or the guide groove is provided on the sub-carrier frame, and the guide stud is disposed on the parent carrier frame.

7. A subrack, comprising:
   a sub-carrier frame;
   a parent carrier frame; and
   a plug-in mechanism,
   wherein the plug-in mechanism is disposed on two opposite sides of the sub-carrier frame and two corresponding sides of the parent carrier frame, and the plug-in mechanism comprises a driving part and a gearing part, wherein:
   the driving part comprises an ejector lever; and the gearing part comprises at least one gear that is engaged successively, a gear at one end is connected to the ejector lever, each of the at least one gear is fastened onto the sub-carrier frame by using a rotating shaft, and the at least one gear is connected to the parent carrier frame by using a linkage structure, wherein the linkage structure comprises a horizontal groove and a linkage stud that can slide in the horizontal groove.

8. The subrack according to claim 7, wherein ejector levers of plug-in mechanisms on the two sides are connected by using a connecting rod, so as to implement linkage between the plug-in mechanisms on the two sides.

9. A finished board, comprising:
a subrack;
a daughter board; and
a mainboard,
wherein the subrack comprises a sub-carrier frame, a parent carrier frame and a plug-in mechanism, wherein the plug-in mechanism is disposed on two opposite sides of the sub-carrier frame and two corresponding sides of the parent carrier frame, and the plug-in mechanism comprises a driving part and a gearing part, wherein:

the driving part comprises an ejector lever;
the gearing part comprises at least one gear that is engaged successively, a gear at one end is connected to the ejector lever, each of the at least one gear is fastened onto the sub-carrier frame by using a rotating shaft, and the at least one gear is connected to the parent carrier frame by using a linkage structure,
wherein the daughter board and the mainboard are disposed in a sub-carrier frame and a parent carrier frame respectively, and plug-in and plug-out of the sub-carrier frame in the parent carrier frame implement connection and detachment between the daughter board and the mainboard, wherein the linkage structure comprises a horizontal groove and a linkage stud that can slide in the horizontal groove.

10. The finished board according to claim 9, wherein a connector is disposed on the daughter board and the mainboard, and a free end of the connector disposed on the daughter board can be plug-connected to a free end of the connector disposed on the mainboard.

* * * * *

UNITED STATES PATENT AND TRADEMARK OFFICE
CERTIFICATE OF CORRECTION

PATENT NO. : 9,462,719 B2
APPLICATION NO. : 14/543265
DATED : October 4, 2016
INVENTOR(S) : Dingqiang Wu et al.

Page 1 of 1

It is certified that error appears in the above-identified patent and that said Letters Patent is hereby corrected as shown below:

In the Claims

Column 8, Line 41, Claim 5:
Delete "elector" and insert --ejector--, therefor.

Column 8, Line 44, Claim 5:
Delete "elector" and insert --ejector--, therefor.

Signed and Sealed this
Tenth Day of January, 2017

Michelle K. Lee
*Director of the United States Patent and Trademark Office*